(12) United States Patent
Wang

(10) Patent No.: US 12,352,812 B2
(45) Date of Patent: Jul. 8, 2025

(54) SUBSTRATE WITH CRACK DETECTION FUNCTION

(71) Applicant: TRIPLE WIN TECHNOLOGY(SHENZHEN) CO. LTD., Shenzhen (CN)

(72) Inventor: Kai-Li Wang, Shenzhen (CN)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 176 days.

(21) Appl. No.: 18/367,641

(22) Filed: Sep. 13, 2023

(65) Prior Publication Data
US 2024/0168085 A1    May 23, 2024

(30) Foreign Application Priority Data
Nov. 18, 2022 (CN) .......................... 202223068227.9

(51) Int. Cl.
G01R 31/28 (2006.01)

(52) U.S. Cl.
CPC ................................ G01R 31/2884 (2013.01)

(58) Field of Classification Search
CPC ............... G01R 31/26; G01R 31/2642; G01R 31/2648; G01R 31/2831; G01R 31/31702
See application file for complete search history.

(56) References Cited

U.S. PATENT DOCUMENTS

| | | | | |
|---|---|---|---|---|
| 2015/0035556 A1* | 2/2015 | Kaltalioglu | ........ | G01R 31/2601 324/762.03 |
| 2015/0115266 A1* | 4/2015 | Sanchez | .................. | H01L 22/20 438/18 |
| 2023/0168300 A1* | 6/2023 | Giacomini | .............. | H01L 22/34 |

FOREIGN PATENT DOCUMENTS

| | | | |
|---|---|---|---|
| CN | 112885845 A | 6/2021 | |
| CN | 115224100 A | 10/2022 | |

* cited by examiner

Primary Examiner — Tung X Nguyen
(74) Attorney, Agent, or Firm — ScienBiziP, P.C.

(57) ABSTRACT

A substrate with a crack detection function, comprising an installation area for installing hardware, a wiring area, and a detection assembly. The wiring area is set around the installation area. The detection assembly is in the wiring area. The detection assembly includes a plurality of detecting units and a plurality of connecting units. The plurality of detecting units is set around the wiring area. Two ends of each connecting unit are respectively connected to two detecting units, forming a circuit for detecting whether cracks exist in the substrate. Each detecting unit includes at least two detecting endpoints. Each connecting unit includes at least two detecting wires, with each end of one detecting wire connected to one detecting endpoint of two detecting units. The at least two detecting wires between two non-adjacent detecting units are set around outside of the installation area to form a closed loop area.

18 Claims, 3 Drawing Sheets

SUBSTRATE WITH CRACK DETECTION FUNCTION

FIELD

The present disclosure relates to field of substrate inspection technology, particularly to a substrate with crack detection function.

BACKGROUND

Ceramic substrates are gradually replacing ordinary substrates in the production of precision equipment due to their good processing performance, high dimensional accuracy, and sufficient mechanical strength for mounting various components. However, ceramic substrates are more brittle due to their higher hardness compared to ordinary substrates. Fractures in ceramic substrates can occur not only at the edges but also in the inner sections close to the installed hardware.

Currently, crack detection in ordinary substrates is mostly done by detecting the resistance of wiring. This method involves setting a circle of crack detecting wires at edges of the ordinary substrate and then detecting the resistance of these lines to determine the presence of cracks. However, this method can only detect whether there are cracks at the edges of the substrate and cannot determine a specific location of the cracks within the substrate. Additionally, few detecting endpoints in this resistance-based method result in lower overall detection accuracy.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DESCRIPTION OF MAIN COMPONENTS OR ELEMENTS

Figure 1:
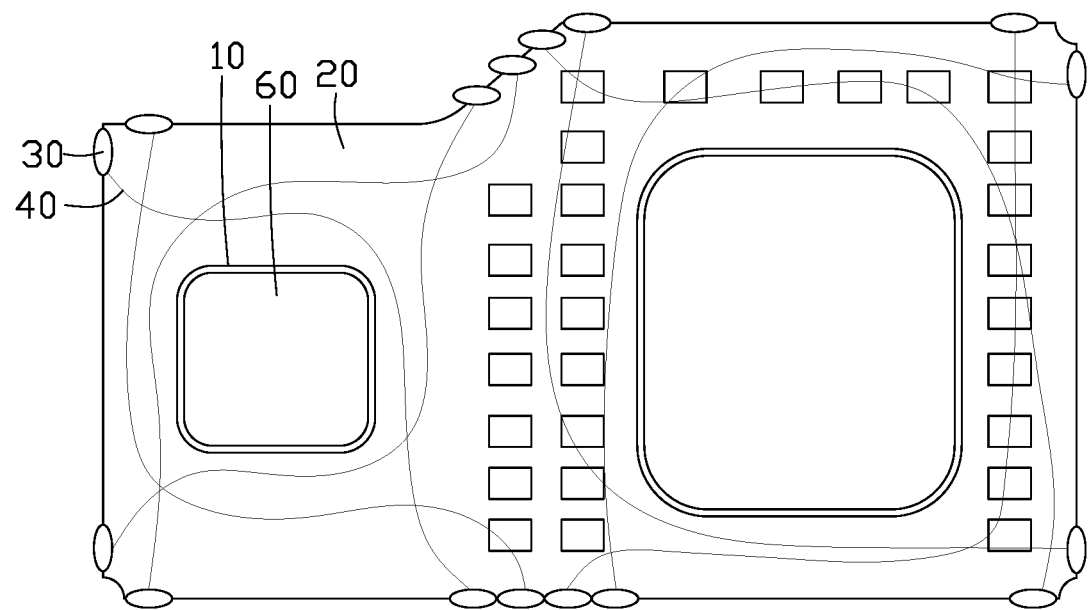
FIG. 1 is a schematic view of a substrate with crack detection function in one embodiment.

Substrate 100, installation area 10, first side 11, second side 12, third side 13, fourth side 14, wiring area 20, detecting unit 30, detecting endpoint 31, connecting unit 40, detecting wire 41, first detecting wire 411, second detecting wire 412, third detecting wire 413, fourth detecting wire 414, closed loop area 42, detection device 50, hardware 60, resistor 70.

DETAILED DESCRIPTION

In order to make the above-mentioned objects, features and advantages of the present application more obvious, a detailed description of specific embodiments of the present application will be described in detail with reference to the accompanying drawings. A number of details are set forth in the following description so as to fully understand the present application. However, the present application can be implemented in many other ways different from those described herein, and those skilled in the art can make similar improvements without violating the contents of the present application. Therefore, the present application is not to be considered as limiting the scope of the embodiments described herein.

Several definitions that apply throughout this disclosure will now be presented.

The term "coupled" is defined as coupled, whether directly or indirectly through intervening components, and is not necessarily limited to physical connections. The connection may be such that the objects are permanently coupled or releasably coupled. The term "substantially" is defined to be essentially conforming to the particular dimension, shape, or other feature that the term modifies, such that the component need not have that exact feature. The term "comprising," when utilized, means "including, but not necessarily limited to"; it specifically indicates open-ended inclusion or membership in the so-described combination, group, series, and the like.

Unless otherwise defined, all technical and scientific terms used herein have the same meaning as commonly understood by one skilled in the art. The terms used in a specification of the present application herein are only for describing specific embodiments and are not intended to limit the present application. The terms "and/or" used herein includes any and all combinations of one or more of associated listed items.

Some embodiments of the present application are described in detail. In the case of no conflict, the following embodiments and the features in the embodiments can be combined with each other.

Figure 2:
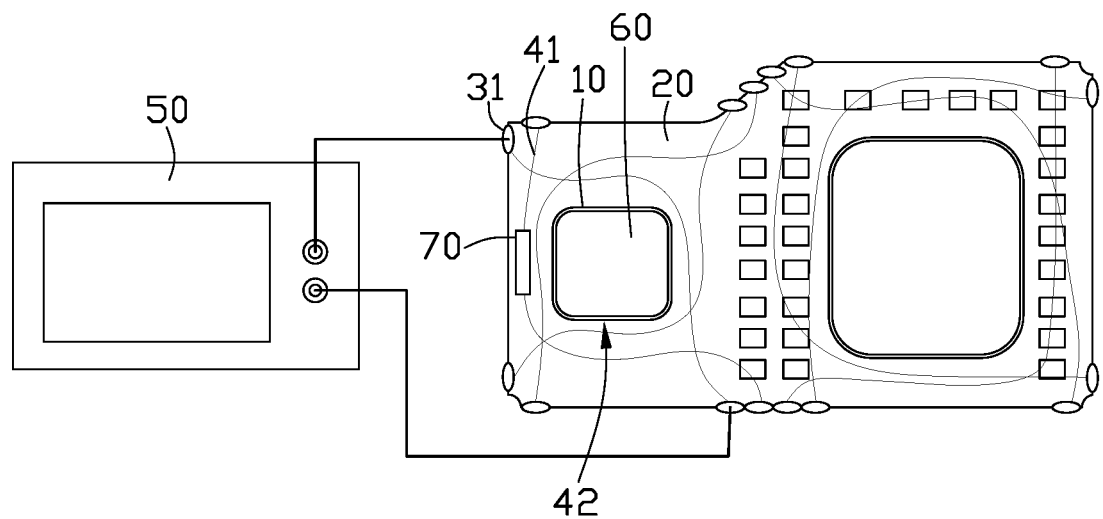
FIG. 2 is a schematic view of the substrate with crack detection function in one embodiment.

Referring to FIG. 1 and FIG. 2, an embodiment of the present application discloses a substrate 100 with crack detection function. The substrate 100 includes an installation area 10, a wiring area 20, and a detection assembly. The installation area 10 is configured for installing hardware 60. The wiring area 20 is set around an outer side of the installation area 10. The detection assembly is positioned in the wiring area 20. The detection assembly includes a plurality of detecting units 30 and a plurality of connecting units 40. The plurality of detecting units 30 are arranged around an outer side of the wiring area 20. Two ends of each of the plurality of connecting unit 40 are respectively connected to two detecting units 30 to form a circuit for detecting presence of cracks in the substrate 100. The plurality of detecting unit 30 includes at least two detecting endpoints 31. The plurality of connecting unit 40 includes at least two detecting wires 41. Two ends of each detecting wire 41 are respectively connected to detecting endpoints 31 of the two detecting units 30. Specifically, an end of the detecting wire 41 is connected to a detecting endpoint 31 of a detecting unit 30, another end of the detecting wire 41 is connected to a detecting endpoint 31 of another detecting unit 30. The at least two detecting wires 41 are arranged between two non-adjacent detecting units 30, and are arranged around an outside of the installation area 10 to form a closed loop area 42.

Specifically, the installation area 10 is configured for installing hardware 60, such as chips or sensors. The wiring area 20 refers to the portion of the substrate 100 that is outside the installation area 10. The detecting wires 41 are routed on the wiring area 20. Compare with other circuits on the substrate 100, the line with of the detecting wire 41 is the thinnest. This ensures that the detecting wires 41 do not interfere with other circuits on the substrate 100.

In one embodiment, a plurality of installation areas 10 are set on the substrate 100. A plurality of wiring areas 20 are also set on the substrate 100 according to the plurality of installation areas 10. Quantity of the wiring areas 20 is same as the installation areas 10, to ensure that each installation area 10 is surrounded by detecting wires 41. This prevents any gaps in the detecting wires 41 between two installation areas 10, ensuring that no cracks go undetected.

By dividing the substrate 100 into installation areas 10 and wiring areas 20 in an inward-to-outward manner, and setting a plurality of detecting units 30 along the outer side of the wiring areas 20, each two detecting units 30 are connected by connecting units 40, and the connecting units 40 are designed to include at least two detecting wires 41, ensuring that at least two detecting wires 41 of the same connecting unit 40 can fully surround the installation area 10 and form a closed loop area 42. This not only prevents missed detection but also allows for localization of cracks based on the continuity of different detecting wires 41. By mutually verifying through a plurality of detecting wires 41, accuracy of the detection can be improved.

In one embodiment, two installation areas 10 are set on the substrate 100. Correspondingly, two wiring areas 20 are also set on the substrate 100. Each of the two wiring areas 20 surrounds one of the installation areas 10. A plurality of detecting units 30 are set to surround each of the installation areas 10, and any two detecting units 30 are connected through connecting units 40 to form two closed loop areas 42. These closed loop areas 42 surround the outer sides of the installation areas 10, ensuring that the presence of a crack at any point on the outer side of the installation areas 10 will affect the continuity of the detecting wires 41 in the connecting units 40.

Referring to FIG. 2, the plurality of detecting units 30 are positioned at each endpoint of the wiring area 20. In one embodiment, the wiring area 20 is a rectangular area. In other embodiments, the wiring area 20 can also have other shapes such as pentagon or hexagon. In one embodiment, the plurality of detecting units includes four detecting units 30. The four detections units 30 are respectively positioned at four endpoints of the wiring area 20, so that the four detecting units 30 are evenly distributed around the wiring area 20, facilitating the subsequent arrangement of detecting wires 41. It prevents the detecting wires 41 in certain areas of the wiring area 20 from being too tightly arranged, while other areas have sparse detecting wires 41.

In one embodiment, the detecting units 30 can also be individually placed at various sides of the wiring area 20. Additionally, each detecting unit 30 can be positioned at the same or different positions on each side of the wiring area 20. Therefore, the relative position of the detecting units 30 with respect to the wiring area 20 does not affect the implementation of the disclosed solution in this application. It merely alters routing path of the detecting wires 41.

In some embodiment, when the wiring area 20 is in a rectangular structure, the number of detecting units 30 can be five or three. The specific quantity of detecting units can be adjusted according to the wiring space available in the wiring area 20.

Referring to FIG. 2, the detecting endpoints 31 are welded to an outer sidewall of the wiring area 20. In one embodiment, by welding the detecting endpoints 31 to the outer sidewall of the wiring area 20, not only does it maximize the spacing between the detecting wires 41, preventing missed detections and improving the reliability of the detection results, but it also facilitates direct connection between the detecting endpoints 31 and a detection device 50, preventing any damage to the circuit board or other circuits on the board caused by the detection device 50.

Referring to FIG. 2, the ends of the at least two detecting wires 41 of the same connecting unit 40 are set to cross each other. In one embodiment, when the ends of the detecting wires 41 in the same connecting unit 40 are arranged in a closed loop area 42 surrounding the installation area 10, the ends of the detecting wires 41 in the same detecting unit 30 will close off end portions of the closed loop area 42, ensuring that the closed loop area 42 forms an enclosed loop structure and preventing any possibility of missed detection.

Referring to FIG. 2, the at least two detecting wires 41 in the same wiring unit 40 are set to surround different sides of the installation area 10. In one embodiment, a connecting unit 40 can be provided with two, three, or four detecting wires 41. Each detecting wire 41 surrounds a different side of the installation area 10, to form the closed loop area 42 that surrounds the installation area 10. Moreover, by positioning the detecting wires 41 on different sides of the installation area 10, when conducting line detection on different detecting wires 41, position of cracks can be determined based on current position of the detecting wire 41. This facilitates statistical analysis based on the location of cracks, enabling corresponding improvements to be made, thereby fundamentally preventing the occurrence of cracks.

Referring to FIG. 2, the two ends of one detecting wire 41 are connected to the detecting endpoints 31 of two non-adjacent detecting units 30. In one embodiment, the detecting units 30 are positioned at the respective endpoints of the wiring area 20, and two non-adjacent detecting units 30 are diagonally positioned. An end of the one detecting wire 41 is connected to a detecting endpoint 31 of one detecting unit 30 of the two diagonally positioned detecting units 30, another end of the one detecting wire 41 is connected to a detecting endpoint 31 of the other detecting unit 20 of the two diagonally positioned detecting units 30, such that the one detecting wire 41 surrounds the installation area 10 in a semi-enclosed form. In this case, based on material-saving principles, a connecting unit 40 only needs to have two detecting wires 41 to completely surround the installation area 10 and form a closed loop area 42. Accordingly, each detecting unit 30 is provided with two detecting endpoints 31.

In one embodiment, when the installation area 10 is in the shape of a pentagon or hexagon, the plurality of detecting units 30 are arranged on the outer side of the wiring area 20 in a circumference direction. Two non-adjacent detecting units 30 means that another detecting unit 30 exists between the two detecting units 30, so that the detecting wires 41 can surround two sides of the installation area 10, and at least two detecting wires 41 are provided on the same side of the installation area 10. The presence or absence of a crack on the side of the installation area 10 can be determined by performing continuity tests on a plurality of detecting wires 41, and determining results can be verified with each other by different detection lines 41. In other embodiment, there can also be two or three detecting units 30 between two detecting units 30, more detecting wires 41 would be required to determine whether there are cracks on the side of the installation area 10.

Furthermore, the two ends of the detecting wire 41 are positioned on different sides of the installation area 10. In one embodiment, when the two ends of the detecting wire 41 are positioned on different sides of the installation area 10, the detecting wire 41 is set to surround at least two sides of the installation area 10, reducing the number of detecting wires 41 required, allowing for surrounding the installation area 10 with a smaller number of detecting wires 41, and avoiding excessive interference with other circuits caused by a large number of the detecting wires 41.

Furthermore, the detecting wire 41 is set to surround two sides of the installation area 10. In one embodiment, when the installation area 10 is in a rectangular structure, one connecting unit 40 is provided with two detecting wires 4. The detecting wires 41 are arranged in an "L" shape. Each detecting wire 41 surrounds the sides of installation area 10 in a semi-enclosed form, to form the closed loop area 42.

In other embodiments, the two ends of one connecting unit 40 can also be connected to two adjacent detecting units 30. Specifically, the connecting unit 40 includes two detecting wires 41. One detecting wire 41 surrounds one side of the installation area 10, and the other detecting wire 41 surrounds the remaining three sides of the installation area 10.

At least one resistor 70 is connected in series on each of the detecting wires 41. In one embodiment, by connecting one or more resistors in series on each of detecting wires 41, the line resistance of each detecting wire 41 is increased, making it easier to perform measurements on each detecting wire 41 using instruments such as a multimeter. This allows for a more convenient measurement of the resistance value of the detecting wire 41. Please note that this is just one method to simplify testing of the detecting wire 41, and there may be other methods to achieve similar objectives.

Referring to FIG. 2, two detecting endpoints 31 at two ends of one detecting wire 41 are respectively connected to the detection device 50, forming a circuit. In one embodiment, the detection device 50 is a digital multimeter. Each detecting wire 41 can be electrically connected to the detection device 50. During detecting, the two detecting endpoints 31 are respectively connected to an input terminal and an output terminal of a DC power supply of the detection device 50. This allows for measuring circuit voltage and circuit current of the detecting wire 41, and calculating circuit resistance based on the circuit voltage and circuit current. By comparing values of circuit current and circuit resistance with the standard current and standard resistance detected during normal operation of the detecting wire 41, it can be determined whether the detecting wire 41 is broken or not. This further helps determine presence of cracks in the substrate 100. When the detecting wire 41 is broken, the values of the circuit resistance should be infinite, and value of the circuit current should be zero.

Figure 3:
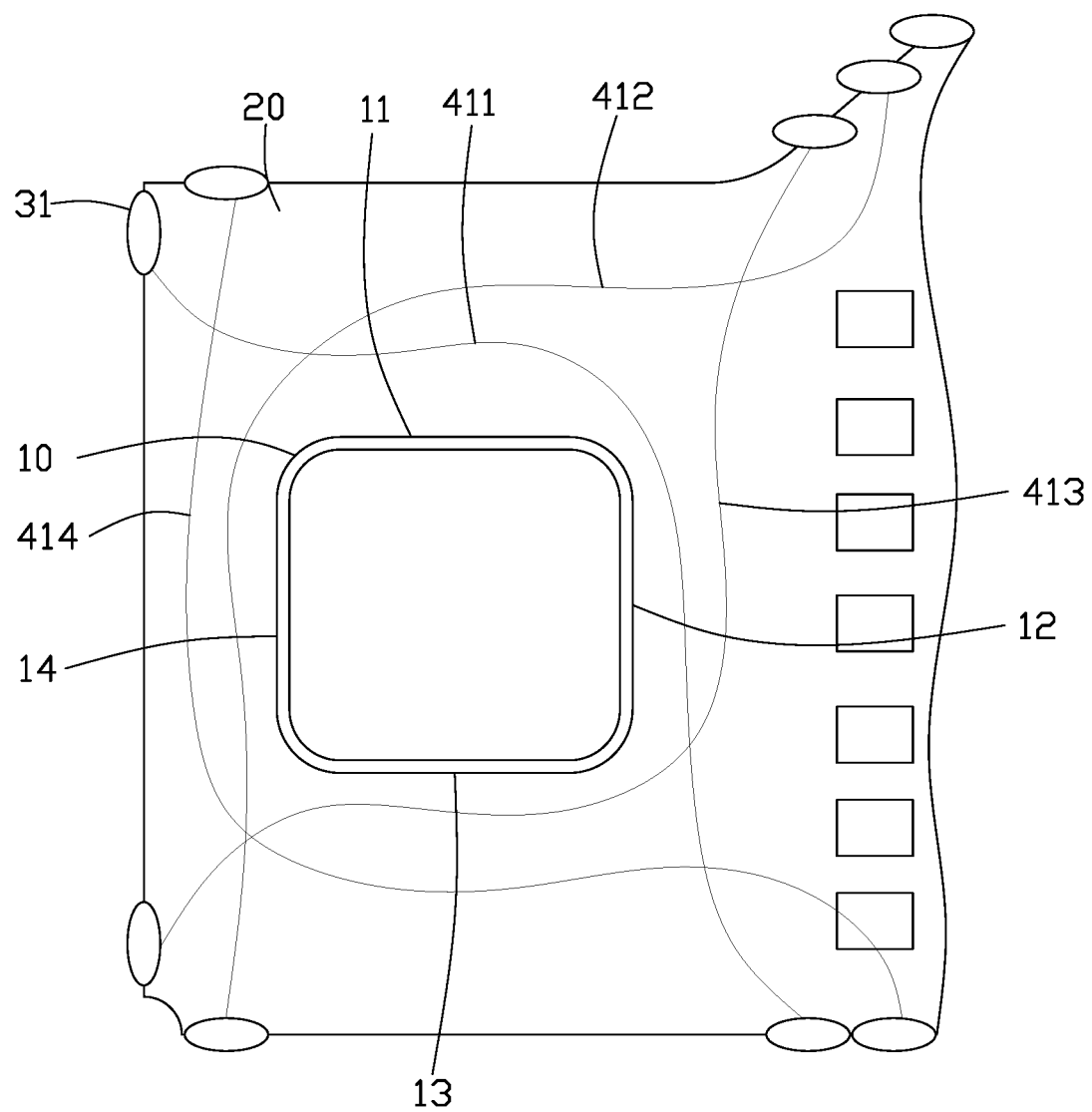
FIG. 3 is a schematic view of the substrate with crack detection function in one embodiment.

Referring to FIG. 3, a detection method is described based on structure shown in FIG. 3 as an example.

Sides of the installation area 10 includes a first side 11, a second side 12, a third side 13, and a fourth side 14 in a clockwise direction. Two detecting wires 41 above the first side 11 includes a first detecting wire 411 and a second detecting wire 412. The first detecting wire 411 is in an "L" shape, and the first detecting wire 411 surrounds the first side 11 and the second side 12. The second detecting wire 412 is also in an "L" shape, and the second detecting wire 42 surrounds the first side 11 and the fourth side 14. Additionally, another detecting wire 41 corresponding to the second side 12 is set as a third detecting wire 413, and another detecting wire 41 corresponding to the fourth side 14 is set as a fourth detecting wire 414.

When a crack detection needs to be conducted on the wiring area 20 corresponding to the first side 11, the continuity of the first detecting wire 411 is checked first, followed by checking the continuity of the second detecting wire 412. If both the first detecting wire 411 and the second detecting wire 412 are continuous, then there are no cracks in the wiring area 20 corresponding to the first side 11. If both the first detecting wire 411 and the second detecting wire 412 are discontinuous, and both the third detecting wire 413 and the fourth detecting wire 414 are continuous, then there are cracks in the wiring area 20 corresponding to the first side 11. If the first detecting wire 411 is discontinuous and the second detecting wire 412 is continuous, then there are cracks in the wiring area 20 corresponding to the second side 12. If the first detecting wire 411 is continuous and the second detecting wire 412 is discontinuous, then there are cracks in the wiring area 20 corresponding to the fourth side 14.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A substrate with crack detection function, comprising:
an installation area for installing hardware,
a wiring area positioned around the installation area, and
a detection assembly positioned in the wiring area,
wherein the detection assembly comprises:
a plurality of detecting units, the plurality of detecting units is positioned around an outer side of the wiring area,
a plurality of connecting units, two ends of each of the plurality of connecting units respectively connected to two of the plurality of detecting units and form a circuit for detecting whether the substrate with crack detection functionality has cracks, and
each of the plurality of detecting units comprises at least two detecting endpoints, and each of the plurality of connecting units comprises at least two detecting wires, two ends of one detecting wire of the at least two detecting wires are respectively connected to detecting endpoints of the at least two detecting units, the at least two detecting wires are arranged between two non-adjacent detecting units, and the at least two detecting wires are arranged around an outer side of the installation area to form a closed loop area.

2. The substrate with crack detection function as claimed in claim 1, wherein, ends of the at least two detecting wires of a same connecting unit are set to cross each other.

3. The substrate with crack detection function as claimed in claim 1, wherein, the at least two detecting wires of a same connecting unit are set around different sides of the installation area.

4. The substrate with crack detection function as claimed in claim 1, wherein, the two ends of the one detecting wire of the at least two detecting wires are respectively connected to detecting endpoints of the two non-adjacent detecting units.

5. The substrate with crack detection function as claimed in claim 4, wherein, the two ends of the one detecting wire of the at least two detecting wires are set on different sides of the installation area.

6. The substrate with crack detection function as claimed in claim 4, wherein, the one detecting wire of the at least two detecting wires surrounds two sides of the installation area.

7. The substrate with crack detection function as claimed in claim 1, wherein, the plurality of detecting units is positioned at each endpoint of the installation area.

8. The substrate with crack detection function as claimed in claim 1, wherein, at least one resistor is connected in series on each of the at least two detecting wire.

9. The substrate with crack detection function as claimed in claim 1, wherein, the detecting endpoints are welded to an outer sidewall of the wiring area.

10. A substrate with crack detection function, comprising:
an installation area for installing hardware,
a wiring area positioned around the installation area, and
a detection assembly positioned in the wiring area,
wherein the detection assembly comprising:
a plurality of detecting units, the plurality of detecting units is positioned around an outer side of the wiring area,
a plurality of connecting units, two ends of each of the plurality of connecting units respectively connected to two detecting units and form a circuit for detecting whether the substrate with crack detection functionality has cracks,
each of the plurality of detecting units comprises at least two detecting endpoints, and each of the plurality of connecting units comprises at least two detecting wires, two ends of one detecting wire of the at least two detecting wires are respectively connected to detecting endpoints of the at least two detecting units, the at least two detecting wires are arranged between two non-adjacent detecting units, and the at least two detecting wires are arranged around an outer side of the installation area to form a closed loop area, and two detecting endpoints at two ends of one detecting wire of the at least two detecting wires are respectively connected to a detection device to form a circuit.

11. The substrate with crack detection function as claimed in claim 10, wherein, ends of the at least two detecting wires of a same connecting unit are set to cross each other.

12. The substrate with crack detection function as claimed in claim 10, wherein, the at least two detecting wires of a same connecting unit are set around different sides of the installation area.

13. The substrate with crack detection function as claimed in claim 10, wherein, the two ends of the one detecting wire of the at least two detecting wires are respectively connected to detecting endpoints of the two non-adjacent detecting units.

14. The substrate with crack detection function as claimed in claim 13, wherein, the two ends of the one detecting wire of the at least two detecting wires are set on different sides of the installation area.

15. The substrate with crack detection function as claimed in claim 13, wherein, the detecting wire surrounds two sides of the installation area.

16. The substrate with crack detection function as claimed in claim 10, wherein, the plurality of detecting units is positioned at each endpoint of the installation area.

17. The substrate with crack detection function as claimed in claim 10, wherein, at least one resistor is connected in series on each of the at least two detecting wire.

18. The substrate with crack detection function as claimed in claim 10, wherein, the detecting endpoints are welded to an outer sidewall of the wiring area.

\* \* \* \* \*